United States Patent
O'Hearcain et al.

(10) Patent No.: US 6,262,608 B1
(45) Date of Patent: Jul. 17, 2001

(54) DELAY LOCKED LOOP WITH IMMUNITY TO MISSING CLOCK EDGES

(75) Inventors: Niall O'Hearcain, Dun Laoghaire; Darren Naughton, Drumcondra, both of (IE)

(73) Assignee: Parthus Technologies PLC, Dublin (IE)

(*) Notice: Subject to any disclaimer, the term of this patent is extended or adjusted under 35 U.S.C. 154(b) by 0 days.

(21) Appl. No.: 09/571,039

(22) Filed: May 15, 2000

Related U.S. Application Data (60) Provisional application No. 60/135,453, filed on May 21, 1999.

(51) Int. Cl.$^7$ .................................................. H03L 7/00
(52) U.S. Cl. ......................... 327/142; 327/149; 327/158
(58) Field of Search ..................................... 327/142, 147, 327/148, 149, 150, 156, 157, 158, 159; 375/373–376; 331/1 A, 10, 11

(56) References Cited

U.S. PATENT DOCUMENTS

| | | |
|---|---|---|
| 4,503,536 | 3/1985 | Panzer . |
| 4,542,354 | 9/1985 | Robinton, et al. . |
| 4,805,192 | 2/1989 | Confalonieri, et al. . |
| 4,974,184 | 11/1990 | Avra . |
| 5,202,978 | 4/1993 | Nozuyama . |
| 5,317,283 * | 5/1994 | Korhonen ............................ 331/1 A |
| 5,561,660 | 10/1996 | Kotowski, et al. . |
| 5,721,547 | 2/1998 | Longo . |
| 5,854,575 | 12/1998 | Fiedler, et al. . |
| 5,936,900 | 8/1999 | Hii, et al. . |
| 6,066,988 * | 5/2000 | Igura ........................................ 331/18 |

OTHER PUBLICATIONS

"Optimization of Phase–Locked Loop Performance In Data Recovery Systems", Ramon S. Co & J.H. Mulligan, Jr., IEEE Journal of Solid—State Circuits, vol. 29, No. 9, 09/94, pp. 1022–1033.

"Basic Opamp Design and Compensation", David Johns, et al., pp. 221–225, 1997.

"Low–Jitter Process–Independent DLL and PLL Based on Self–Biased Techniques", John G. Maneatis, IEEE Journal of Solid–State Circuits, vol. 31, No. 11, 11/96, pp. 1723–1732.

"Monolithic Phase–Locked Loops And Clock Recovery Circuits: Theory and Design", Behzad Razavi, 1996, pp. iii–xi and 1–498.

"A 155–MHz Clock Recovery Delay–and Phase–Locked Loop", Thomas H. Lee, IEEE Journal of Solid–State Circuits, vol. 27, No. 12, Dec. 1992, pp. 1736–1745.

* cited by examiner

Primary Examiner—Toan Tran
Assistant Examiner—Cassandra Cox
(74) Attorney, Agent, or Firm—Blakely, Sokoloff, Taylor & Zafman LLP (57) ABSTRACT

A method for determining whether to trigger a reset of a delay locked loop ("DLL") comprising calculating the difference in time between a reference clock and a delay clock; comparing the difference in time to the amount of time required for a reset signal to reset said DLL; and generating the reset signal to reset the DLL if the reset time is less than the difference in time between the reference clock and the delayed clock.

23 Claims, 6 Drawing Sheets

DELAY LOCKED LOOP WITH IMMUNITY TO MISSING CLOCK EDGES

PRIORITY

This application claims the benefit of the filing date for U.S. Provisional Application No. 60/135,453, filed May 21, 1999.

BACKGROUND OF THE INVENTION

1. Field of the Invention

This invention relates generally to the field of analog circuit design. More particularly, the invention relates to an apparatus and method for ensuring the proper operation of a delay locked loop, even in the presence of missing clock edges.

2. Description of the Related Art

For years, delay locked loops ("DLLs") have been used extensively in the field of analog circuit design. More recently, with the increasingly stringent timing requirements of high performance computing and communications systems today, DLLs are frequently being employed in digital circuit designs (e.g., computer motherboards, high performance multimedia boards, intelligent wireless devices . . . etc).

The design goal of a DLL is to generate a clock which is delayed by a specified number of clock periods with respect to the input clock. For this reason, DLLs are commonly used in applications which require clock-skew elimination, clock/data recovery and multi-phase clock generation.

Figure 1:
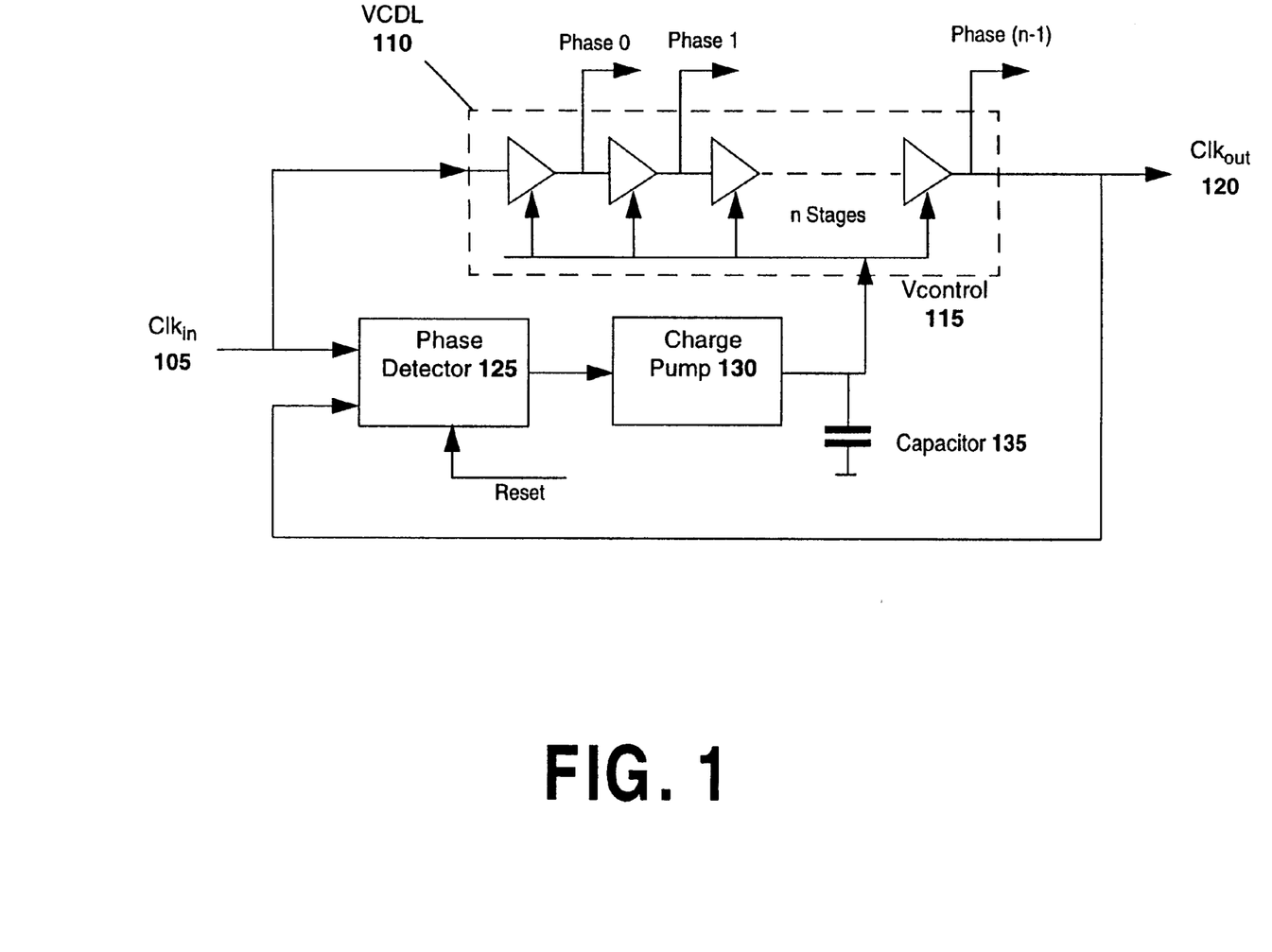
FIG. 1 illustrates a traditional delay locked loop ("DLL").

FIG. 1 illustrates a block diagram of a traditional DLL circuit. The input clock 105, passes through a voltage controlled delay line ("VCDL") 110 which generates a delayed version ($CLK_{out}$) 120 of the input clock 105. The delay in the VCDL 110 must be set precisely to some multiple of the input clock 105 period (e.g., 2×, 3×, etc., depending on the application). The delay through the VCDL 110 is controlled by a control voltage 115. The higher the control voltage 115, the shorter the delay between the input and output clocks.

The control voltage 115 (and, therefore, the amount of delay in the VCDL 110) is modified by a feedback loop which consists of a phase detector 125, a charge pump 130 and a capacitor 135. The phase detector 125 detects the actual time delay (i.e., the phase difference) between the input clock 105 and the output clock 120 and, in response, causes the charge pump 130 to generate either a positive or a negative current pulse. A positive pulse charges the capacitor 135, increasing the control voltage 115, and a negative pulse discharges the capacitor 135, decreasing the control voltage 115. Accordingly, if the delay of the output clock 120 is too high, the charge pump 130 provides a positive current pulse (increasing the control voltage 115), and if the delay is too short, the charge pump 130 provides a negative current pulse (decreasing the control voltage). The feedback loop will settle when the delayed clock 120 is at the desired phase multiple of the input clock 105 (i.e. the delay is 1, 2, 3, etc. input clock periods).

While DLLs have the advantage of lower order transfer functions (hence having high stability with relatively low jitter), it is important that DLLs be started in a known state to ensure that the delayed clock is locked to exactly one reference clock period (or 'n' clock periods, depending on the application). A missing clock edge can cause the phase detector 125 to force the DLL to lock to an incorrect delay which is a multiple of this period (or "zero" delay). In this case, the delayed clock edges may appear to be aligned with the reference clock edges when, in reality, they are improperly skewed by one or more clock periods.

SUMMARY OF THE INVENTION

A method for determining whether to trigger a reset of a delay locked loop ("DLL") comprising calculating the difference in time between a reference clock and a delayed clock; comparing the difference in time to the amount of time required for a reset signal to reset said DLL; and generating the reset signal to reset the DLL if the reset time is less than the difference in time between the reference clock and the delayed clock.

BRIEF DESCRIPTION OF THE DRAWINGS

A better understanding of the present invention can be obtained from the following detailed description in conjunction with the following drawings, in which.

DETAILED DESCRIPTION

In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form to avoid obscuring the underlying principles of the invention.

Embodiments of the present invention include various steps, which will be described below. The steps may be embodied in machine-executable instructions or, alternatively, these steps may be performed by specific hardware components that contain hardwired logic for performing the steps (e.g., an integrated circuit), or by any combination of programmed computer components and custom hardware components.

Elements of the present invention may also be provided as a machine-readable medium for storing machine-executable instructions or other types of code/data (e.g., VHDL code). The machine-readable medium may include, but is not limited to, floppy diskettes, optical disks, CD-ROMs, and magneto-optical disks, ROMs, RAMs, EPROMs, EEPROMs, magnet or optical cards, propagation media or other type of media/machine-readable medium suitable for storing code/data. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Embodiments of The Invention

For the remainder of the detailed description, it will be assumed that the desired phase delay of the output clock 120 is one period relative to the input clock 105. However, it should be noted that the underlying principles of the present invention may be implemented on systems where the desired phase delay is greater than one period of the input clock.

Figure 2A:
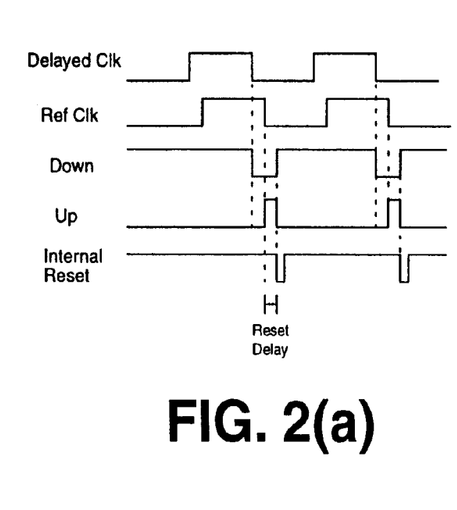
FIGS. 2(a)–(c) illustrates charge pump operation in a traditional delay locked loop.

The operation of a phase detector will now be described with reference to the waveforms illustrated in FIGS. 2(a)–(c). FIG. 2(a) illustrates a scenario where the reference clock 105 leads the delayed clock 120 (i.e., the delayed clock 120 is skewed by less than a single clock period). The falling edge of the delayed clock 120 activates a charge pump 130 pulse on "Down," draining the control voltage 115. A falling edge on the reference clock 105 activates a pulse on "Up," increasing the control voltage 115. When both "Up" and "Down" have been activated the phase detector 125 is reset internally deactivating both "Up" and "Down" signals. The phase detector 125 then waits for the next falling edge (which should be the falling edge of the delayed clock). Note that when both "Up" and "Down" are concurrently active, they tend to cancel one another out. The net result of this operation is that because the width of the pulse on "Down" is longer than the width of the pulse on "Up," the control voltage 115 decreases. This increases the delay in the VCDL 110 and causes the delayed clock 120 to be delayed further.

Figure 2B:
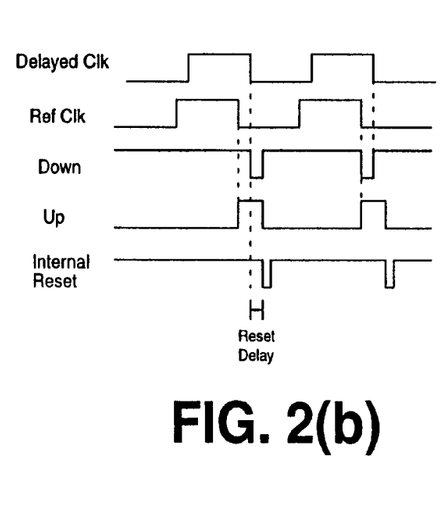

FIG. 2(b) illustrates a scenario where the delayed clock 120 leads the reference clock 105 (i.e., the delayed clock 120 is skewed by more than a single clock period). The falling edge of the reference clock 105 activates a charge pump 130 pulse on "Up" and a falling edge on the delayed clock 120 activates a charge pump 130 pulse on "Down." With both "Up" and "Down" activated the phase detector 125 is reset internally deactivating both "Up" and "Down" signals. The phase detector 125 now waits for the next falling edge which should be the falling edge of the reference clock 105 thus activating "Up" again. The net result is that the width of the pulse on "Up" is longer than the width of the pulse on "Down" thus forcing the control voltage 115 to increase. This decreases the delay in the VCDL 110 and causes the delayed clock 120 to be delayed by a smaller amount.

Figure 2C:
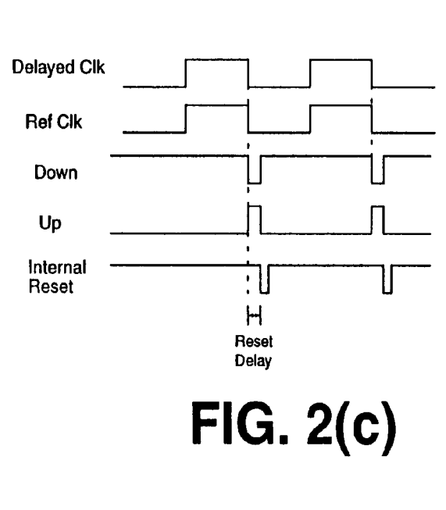

As illustrated in FIG. 2(c), when the delayed clock 120 and the reference clock 105 are in phase (i.e., skewed by exactly one clock period), the DLL is considered locked. In this case the falling edges of the reference clock 105 and the delayed clock 120 occur almost simultaneously, thus activating both the "Up" and "Down" signals. With both "Up" and "Down" activated the phase detector 125 is reset internally deactivating both the "Up" and "Down" signals. However, a finite reset delay exists between the time when the phase detector 125 registers the second falling edge and when the "Up" and "Down" signals are deactivated. This results in a finite period of time when both "Up" and "Down" are active on the charge pump 130. This reset delay can be made longer with the addition of extra gates in the reset path.

Figure 3A:
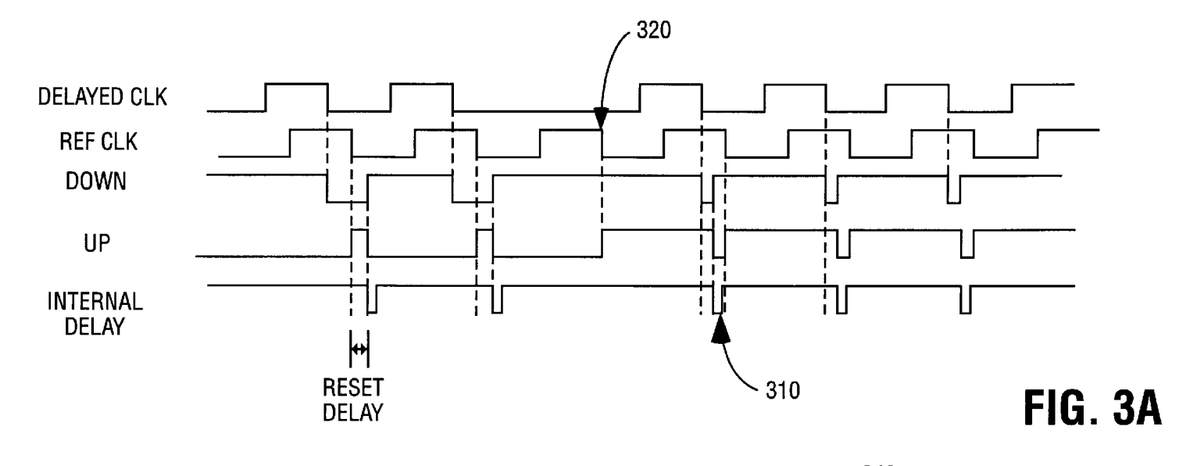
FIGS. 3(a)–(b) illustrates timing problems associated with missing clock edges in traditional delay locked loops.

The phase detector 125 may fail to operate correctly, however, if either the reference clock 105 or the delayed clock 120 misses an edge. Specifically, after a missing clock edge, the phase detector may drive the control voltage 115 in the wrong direction. FIG. 3(a) illustrates this behavior for a missing edge on the delayed clock. The first reset signal after the missing clock edge is triggered on the falling edge of the delayed clock 120 as shown. The timing is such that the first falling edge recognized by the DLL is the falling edge of the reference clock 105. This triggers an "Up" pulse, which is active for an extended period of time (i.e., until the next falling edge of the delayed clock), thereby driving the control voltage 115 in the wrong direction. In other words, if the two clocks 105, 120 are sufficiently skewed such that following the internal reset signal the phase detector 125 sees a falling edge of the reference clock 105 before a falling edge of the delayed clock 120, the DLL will attempt to lock to an incorrect multiple of the reference clock 105.

Figure 3B:
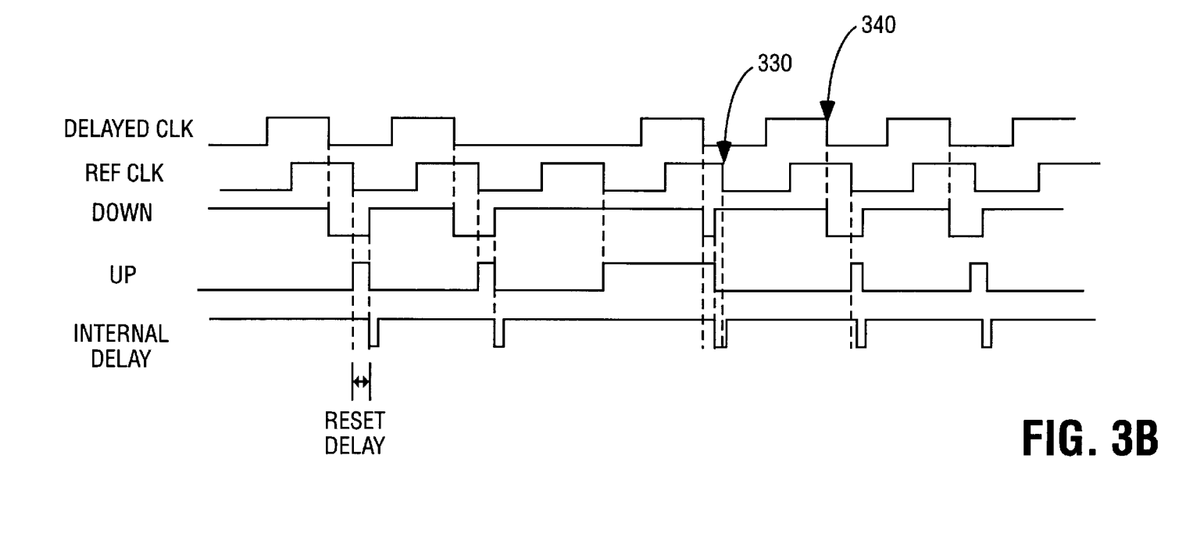

Whether the phase detector 125 enters a state of operation as shown in FIG. 2(a) depends on the timing of the internal reset signal relative to the falling edge of the reference clock 105. In FIG. 3(b) it can be see that the phase detector 125 will be immune to a missing clock edge if the phase difference between the reference clock 105 and the delayed clock 120 is sufficiently small. In other words, because the falling edge of the reference clock 330 in FIG. 3(b) occurs before the DLL comes out of reset, the first falling clock edge following reset is the falling edge of delayed clock 340, and the phase detector 125 returns to normal operation.

Figure 4:
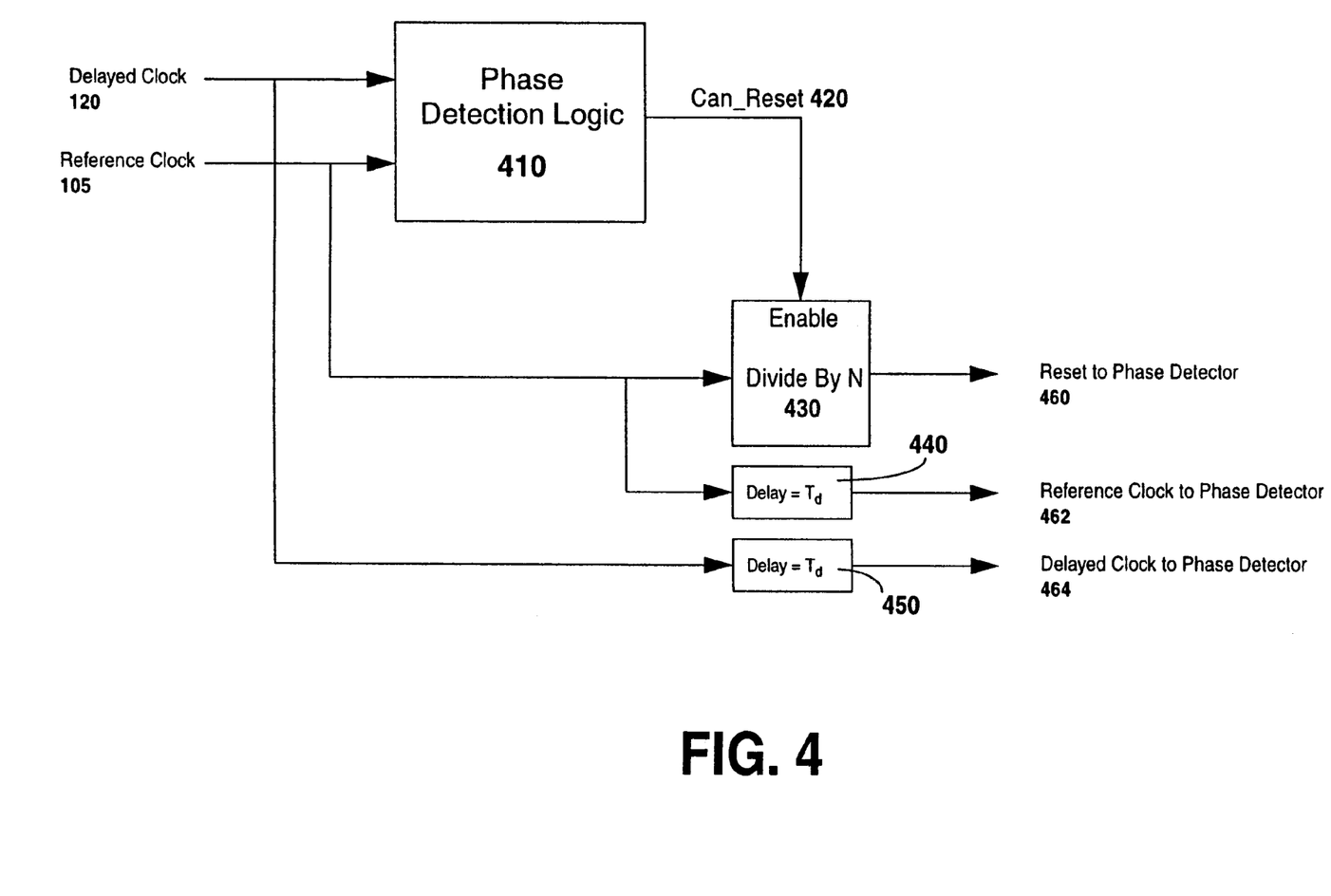
FIG. 4 illustrates an apparatus according to one embodiment of the invention.
Figure 5A:
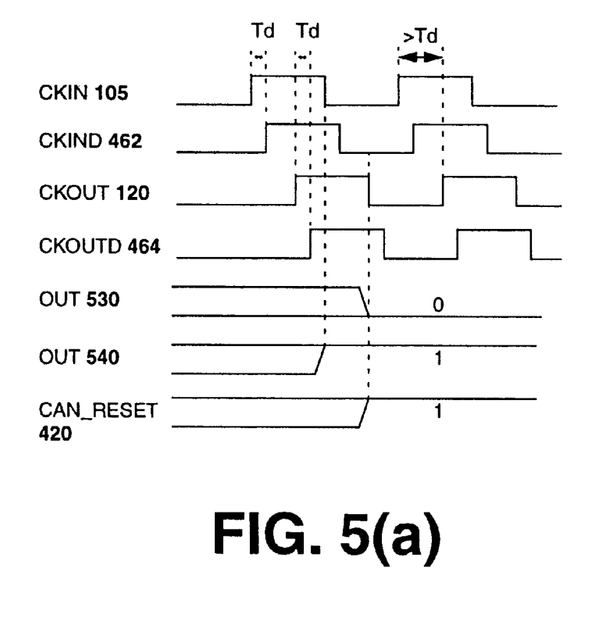
FIG. 5 is a timing diagram illustrating features of the apparatus illustrated in FIG. 4.

One embodiment of the invention is illustrated FIG. 4. The operation of this embodiment will be described with reference to the waveforms shown in FIG. 5. As described above, when a reset signal is applied to the phase detector 125 it should occur after a falling edge on the reference clock 105 and before a falling edge on the delayed clock 120 to ensure that the delayed clock 120 is delayed by a single reference clock 105 period. Therefore, in one embodiment of the invention, a periodic reset signal 460 is triggered on the reference clock 105 (or a fraction thereof).

As illustrated in FIGS. 3(a)–3(b), a finite amount of time is required to generate the reset signal 460. To ensure that the DLL does not enter a state of operation as shown in FIG. 3(a), this time should be less than the time between falling edges of the reference clock 105 and the delayed clock 120. Accordingly, one embodiment of the invention calculates whether there is sufficient time between falling edges of the reference and delayed clocks, 105 and 120, before generating the reset signal 460.

A fixed delay may be introduced into the system to compensate for the time required to make the reset calculations described herein. In one embodiment, the reference clock "CKIN" 105 is delayed by an amount Td (e.g., where Td is greater than or equal to $T_{reset}$) to generate a new signal "CKIND" 462. Similarly, the delayed clock "CKOUT" 120 may be delayed by the same amount "Td" to generate a new signal "CKOUTD" 464. In the embodiment illustrated in FIG. 4, the delay Td is introduced via delay units 440 and 450, respectively.

Figure 5B:
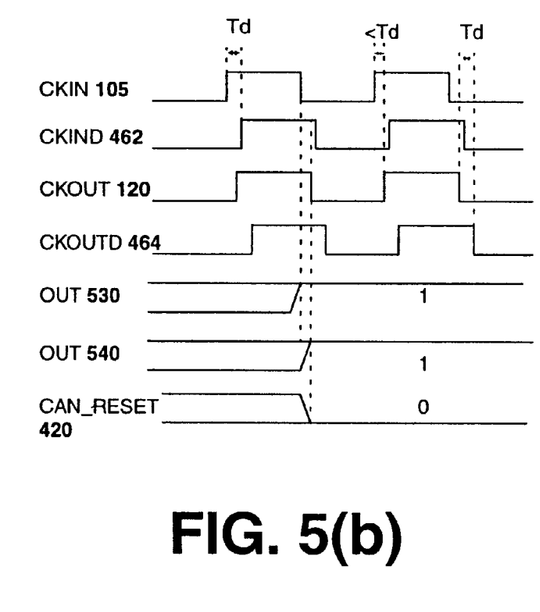

The value of CKIND 462 is sampled with the falling edge of CKOUT 120 to produce an output OUT 530 and the value of CKOUTD 464 is sampled with the falling edge of CKIN 105 to produce an output OUT 540. These two outputs, OUT 530 and OUT 540, are then used to determine whether there is sufficient time to apply a reset signal to the phase detector 125. For example, in one embodiment, the two outputs are used to generate a "CAN_RESET" signal 420 which, when triggered, indicates that there is enough time to reset the phase detector 125. Specifically, if the two outputs are at different logic levels (e.g., 0, 1 or 1, 0), CAN_RESET 420 is triggered, allowing the reset signal 460 to be generated. If, however, the two outputs are at the same logic level (e.g., 1, 1 or 0, 0), CAN_RESET 420 is deactivated, inhibiting the reset signal 460. In one embodiment, the CAN_RESET signal 420 is the output of an XOR gate with the two outputs, OUT 530 and OUT 540, as inputs. In other words, if the delay between CKIN105 and CKOUT 120 is large enough to allow a reset (>Td), OUT 530 and OUT 540 will be either 1,0 or 0,1 depending on which clock is leading. In FIG. 5(b) the delay between CKIN 105 and CKOUT120 is too small (<Td) and OUT 530 and OUT 540 will be 1,1. Similarly, if CKIN 105 and CKOUT 120 are 50 percent out of lock (i.e., 180 degrees out of phase) then OUT 530 and OUT 540 would be 0,0. Thus, if OUT 530 and OUT 540 are different values then the delay between CKIN 105 and CKOUT 120 is large enough to allow a reset (>Td).

As illustrated in FIG. 4, one embodiment of the system includes a "divide by N" module 430, which receives the reference clock 105 as an input and generates a periodic reset signal 460 having a frequency of a the reference clock 105 frequency divided by "N." For example, if N=2 and the frequency of the input clock is 2.4 GHz, then the reset signal will have a frequency of 1.2 GHz (i.e., after the second cycle the phase detector is reset).

The value of "N" may be modified depending on the particular embodiment. The differences between embodiments with different "N" values may be understood by comparing an embodiment with N=2 to an embodiment with N=1000. In the case of a divide-by-two block (i.e., N=2), after every second cycle of the reference clock a reset signal is produced. Thus, if the reset signal is a 50—50 duty cycle signal then the phase detector is in reset half of the time (for one cycle). Since the phase detector is in reset half of the time (when the periodic reset is active) no pulses are delivered to the charge pump during this time so it would take longer to for the loop to settle out at the correct control voltage.

By contrast, if a divide-by-1000 block is used, for example, it may be undesirable for the phase detector to be in reset for 500 cycles. As such, some circuitry may be added to ensure that the phase detector is in reset mode for 1 cycle out of the 1000, and operating normally for 999 cycles. The disadvantages this embodiment are that a greater chip surface area may be needed to support the logic of additional dividers, and/or that a missing clock will go undetected for a longer period of time since the frequency of the reset signal is lower. The advantage of this embodiment, however, is that the phase detector is only in reset mode for 1 out of 1000 cycles and should therefore settle out at the correct control voltage sooner than the divide by two embodiment. Different embodiments may be configured with different "N" values based on the particular application at hand.

In one embodiment, the reference clock 105 and delayed clock 120 are each passed through delay modules 440 and 450, respectively. The delay modules 440, 450, may be configured to delay the reference clock 105 and delayed clock 120 by a factor of $T_{reset}$ before being applied to the phase detector, thereby bringing the reset edge closer to the falling edge of the reference clock.

Figure 6:
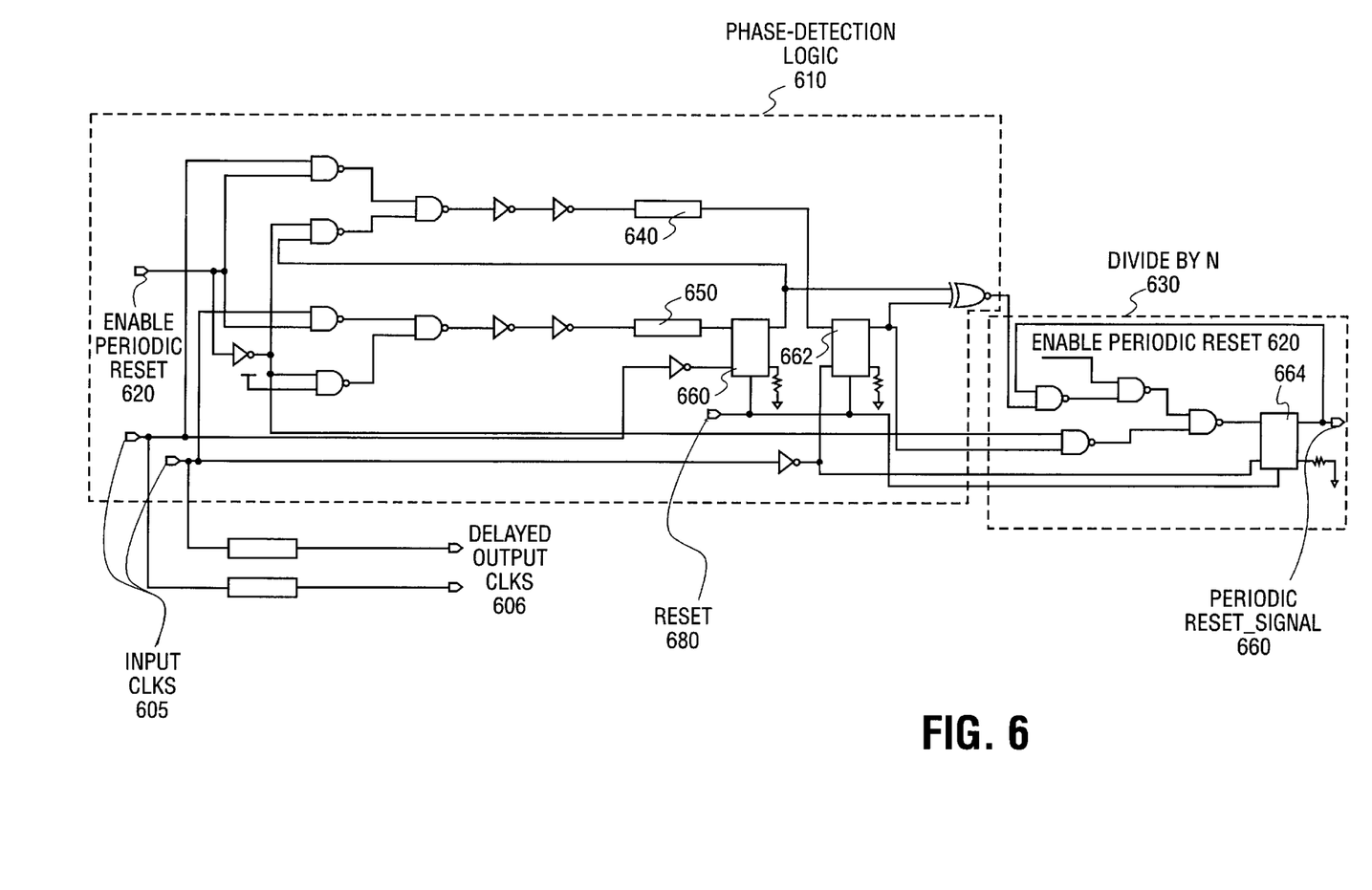
FIG. 6 is a gate-level schematic of a divide-by-two embodiment of the invention.

FIG. 6 illustrates a gate level schematic of a divide-by-two (N=2) embodiment. This embodiment is comprised generally of a divide-by-two logic portion 630 and a phase detection logic portion 610. Within the phase detection logic portion are delay elements 640, 650 and two flip-flops 660, 662 for sampling CKIND 462 with the falling edge of CKOUT 120 to produce the output OUT 530, and CKOUTD 464 with the falling edge of CKIN 105 to produce the output OUT 540. Also illustrated in FIG. 6 are input clocks 605, delayed output clocks 606, an enable periodic reset signal 620, a reset signal 680 (for resetting flip-flops 660, 662, 664), and a periodic reset signal 660. It should be noted, however, that this embodiment is included for the purpose of illustration only and is not necessary for complying with the underlying principles of the invention.

It should also be rioted that the apparatus and method described herein may be implemented in environments other than a physical integrated circuit ("IC"). For example, the circuitry may be incorporated into a format or machine-readable medium for use within a software tool for designing a semiconductor IC. Examples of such formats and/or media include computer readable media having a VHSIC Hardware Description Language ("VHDL") description, a Register Transfer Level ("RTL") netlist, and/or a GDSII description with suitable information corresponding to the described apparatus and method.

Throughout the foregoing description, for the purpose of explanation, numerous specific details were set forth in order to provide a thorough understanding of the invention. It will be apparent, however, to one skilled in the art that the invention may be practiced without some of these specific details. For example, while the embodiments described above attempt to lock to a one-period phase delay between the input clock 105 and the delay clock 120, the underlying principles of the invention may practiced on embodiments which attempt to lock to multiple period phase delays.

Moreover, while the DLL components illustrated and described above trigger on a falling clock edge, the principles of the invention may be implemented using components which trigger on rising clock edges, or using combinations of components which trigger on both rising and falling clock edges. Accordingly, the scope and spirit of the invention should be judged in terms of the claims which follow.

What is claimed is:

1. A method for determining whether to trigger a reset of a delay locked loop ("DLL") comprising:
   calculating a difference in time between a reference clock and a delayed clock;
   comparing said difference in time to a reset time, said reset time being an amount of time required for a reset signal to reset said DLL; and
   generating said reset signal to reset said DLL if said reset time is less than said difference in time between said reference clock and said delayed clock.

2. The method as in claim 1 wherein said reset signal is a periodic reset signal generated at a frequency of less than or equal to said reference clock's frequency.

3. The method as in claim 2 wherein said periodic reset signal is triggered on an edge of said reference clock.

4. The method as in claim 3 wherein said periodic reset signal is triggered on a falling edge of said reference clock.

5. The method is in claim 1 further comprising:
   delaying said reference clock (hereinafter "CKIN") and said delayed clock (hereinafter "CKOUT") by an amount $T_d$ to produce clock signals CKIND and CKOUTD, respectfully; and
   sampling CKIND with a falling edge of CKOUT to produce a binary output OUT1;
   sampling CKOUTD with a falling edge of CKIN to produce a binary output OUT2; and
   generating said reset signal only if OUT1 and OUT2 are at different logic levels.

6. A delay-locked loop ("DLL") having a reference clock and a delayed clock comprising:
   periodic reset logic configured to trigger a periodic DLL reset signal upon sensing an edge of said reference clock; and
   reset timing logic configured to determine whether an amount of time required to generate said reset signal is less than the time between corresponding edges of said reference clock and said delayed clock; and
   reset enable/disable logic configured to disable said periodic reset logic if said time required to generate said reset signal is greater than said time between corresponding edges of said reference clock and said delayed clock.

7. The DLL as in claim 6 wherein said periodic reset logic is configured to trigger a periodic reset signal upon sensing an edge of said delayed clock.

8. The DLL as in claim 6 wherein said periodic reset logic is comprised of divide-by-N logic for decreasing said periodic reset signal's frequency by a factor of N relative to said reference clock's frequency.

9. The DLL as in claim 8 wherein N=2.

10. The DLL as in claim 6 wherein said reset timing logic is comprised of:

one or more delay units configured to delay said reference clock (hereinafter "CKIN") and said delayed clock (hereinafter "CKOUT") by an amount $T_d$ to produce clock signals CKIND and CKOUTD, respectfully;

sampling logic configured to sample CKIND with an edge of CKOUT to produce a binary output OUT1, and to sample CKOUTD with an edge of CKIN to produce a binary output OUT2; and wherein said reset enable/disable logic is configured to enable said reset signal only if OUT1 and OUT2 are at different logic levels.

11. The DLL as in claim 10 wherein said sampling logic is configured to sample CKIND with a falling edge of CKOUT to produce said binary output OUT1 and to sample CKOUTD with a falling edge of CKIN to produce said binary output OUT2.

12. A delay-locked loop ("DLL") having a reference clock and a delayed clock comprising:

periodic reset means configured to trigger a periodic DLL reset signal upon sensing an edge of said reference clock; and reset timing means configured to determine whether an amount of time required to generate said reset signal is less than the time between corresponding edges of said reference clock and said delayed clock; and reset enable/disable means configured to disable said periodic reset logic if said time required to generate said reset signal is greater than said time between corresponding edges of said reference clock and said delayed clock.

13. The DLL as in claim 12 wherein said periodic reset means is configured to trigger a periodic reset signal upon sensing an edge of said delayed clock.

14. The DLL as in claim 6 wherein said periodic reset means is comprised of divide-by-N means for decreasing said periodic reset signal's frequency by a factor of N relative to said reference clock's frequency.

15. The DLL as in claim 14 wherein N=2.

16. The DLL as in claim 12 wherein said reset timing means is comprised of:

delay means configured to delay said reference clock (hereinafter "CKIN") and said delayed clock (hereinafter "CKOUT") by an amount $T_d$ to produce clock signals CKIND and CKOUTD, respectfully;

sampling means configured to sample CKIND with an edge of CKOUT to produce a binary output OUT1, and to sample CKOUTD with an edge of CKIN to produce a binary output OUT2; and wherein said reset enable/disable means is configured to enable said reset signal only if OUT1 and OUT2 are at different logic levels.

17. The DLL as in claim 16 wherein said sampling means is configured to sample CKIND with a falling edge of CKOUT to produce said binary output OUT1 and to sample CKOUTD with a falling edge of CKIN to produce said binary output OUT2.

18. A machine-readable medium having code stored thereon which defines an integrated circuit (IC), said IC comprising:

periodic reset logic configured to trigger a periodic DLL reset signal upon sensing an edge of said reference clock; and reset timing logic configured to determine whether an amount of time required to generate said reset signal is less than the time between corresponding edges of said reference clock and said delayed clock; and reset enable/disable logic configured to disable said periodic reset logic if said time required to generate said reset signal is greater than said time between corresponding edges of said reference clock and said delayed clock.

19. The machine-readable medium as in claim 18 wherein said code stored thereon defines periodic reset logic configured to trigger a periodic reset signal upon sensing an edge of said delayed clock.

20. The machine-readable medium as in claim 18 wherein said code stored thereon defines reset logic comprised of divide-by-N logic for decreasing said periodic reset signal's frequency by a factor of N relative to said reference clock's frequency.

21. The machine-readable medium as in claim 20 wherein N=2.

22. The machine-readable medium as in claim 18 wherein said code stored thereon defines reset timing logic comprised of:

one or more delay units configured to delay said reference clock (hereinafter "CKIN") and said delayed clock (hereinafter "CKOUT") by an amount $T_d$ to produce clock signals CKIND and CKOUTD, respectfully;

sampling logic configured to sample CKIND with an edge of CKOUT to produce a binary output OUT1, and to sample CKOUTD with an edge of CKIN to produce a binary output OUT2; and wherein said reset enable/disable logic is configured to enable said reset signal only if OUT1 and OUT2 are at different logic levels.

23. The machine-readable medium as in claim 22 having code stored thereon which defines sampling logic configured to sample CKIND with a falling edge of CKOUT to produce said binary output OUT1 and to sample CKOUTD with a falling edge of CKIN to produce said binary output OUT2.

* * * * *